US010872936B2

(12) United States Patent
Wu et al.

(10) Patent No.: US 10,872,936 B2
(45) Date of Patent: Dec. 22, 2020

(54) DISPLAY DEVICE HAVING BOTH ORGANIC ELECTROLUMINESCENT DISPLAY PANEL AS BACKLIGHT SOURCE AND LIQUID CRYSTAL DISPLAY PANEL

(71) Applicant: BOE Technology Group Co., Ltd., Beijing (CN)

(72) Inventors: Changyen Wu, Beijing (CN); Bin Bo, Beijing (CN); Guang Yan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 169 days.

(21) Appl. No.: 16/140,648

(22) Filed: Sep. 25, 2018

(65) Prior Publication Data

US 2019/0189726 A1    Jun. 20, 2019

(30) Foreign Application Priority Data

Dec. 18, 2017    (CN) .......................... 2017 1 1364065

(51) Int. Cl.
*G02F 1/1335*    (2006.01)
*H01L 27/32*    (2006.01)
(Continued)

(52) U.S. Cl.
CPC .... *H01L 27/3232* (2013.01); *G02F 1/133514* (2013.01); *G02F 1/133603* (2013.01);
(Continued)

(58) Field of Classification Search
CPC ......... G02F 1/133603; G02F 1/133609; G02F 1/133621; G02F 1/133514; G02F 2201/44;
(Continued)

(56) References Cited

U.S. PATENT DOCUMENTS 7,598,939 B2 * 10/2009 Sumiyoshi ........ G02F 1/133621
345/102
7,616,272 B2 * 11/2009 Miner ............... G02F 1/133602
349/69
(Continued)

FOREIGN PATENT DOCUMENTS

CN    1830218 A    9/2006
CN    101295096 A    10/2008
(Continued)

OTHER PUBLICATIONS

First Office Action, including Search Report, for Chinese Patent Application No. 201711364065.4, dated Dec. 16, 2019, 9 pages.

*Primary Examiner* — Paisley L Wilson
(74) *Attorney, Agent, or Firm* — Westman, Champlin & Koehler, P.A.

(57) ABSTRACT

A display device is provided in embodiments of the disclosure relating to the field of display technology, the display device including: a liquid crystal display panel; and an organic electroluminescent display panel provided opposite to the liquid crystal display panel and configured to function as a backlight source for the liquid crystal display panel; the liquid crystal display panel has a display region defined therein, and comprises a plurality of pixel units arranged in an array and located in the display region, each of the plurality of pixel units comprising a plurality of sub-pixel units; the organic electroluminescent display panel has a light-emitting region defined therein and opposite to the display region, and comprises a plurality of light-emitting units arranged in an array and located in the light-emitting region, each of the plurality of light-emitting units comprising a plurality of light-emitting sub-units; and an area of each of the plurality of sub-pixel units is smaller than an area
(Continued)

of a corresponding one of the plurality of light-emitting sub-units at least overlapping therewith.

16 Claims, 3 Drawing Sheets

(51) Int. Cl.
*G02F 1/13357* (2006.01)
*H01L 51/50* (2006.01)

(52) U.S. Cl.
CPC .. *G02F 1/133609* (2013.01); *G02F 1/133621* (2013.01); *H01L 27/322* (2013.01); *H01L 27/3267* (2013.01); *H01L 51/5036* (2013.01); *G02F 2201/44* (2013.01); *G02F 2201/52* (2013.01); *H01L 2251/5361* (2013.01)

(58) Field of Classification Search
CPC ............. G02F 2201/52; H01L 27/3232; H01L 27/322; H01L 27/3267; H01L 51/5036; H01L 2251/5361
See application file for complete search history.

(56) References Cited

U.S. PATENT DOCUMENTS

| | | | |
|---|---|---|---|
| 7,619,604 B2 | 11/2009 | Karman et al. | |
| 2006/0187179 A1 | 8/2006 | Karman et al. | |
| 2015/0228232 A1 | 8/2015 | Lee et al. | |
| 2016/0055781 A1* | 2/2016 | Phan | G09G 3/2003 |
| | | | 345/690 |
| 2017/0139218 A1* | 5/2017 | Lu | G02B 30/27 |

FOREIGN PATENT DOCUMENTS

| | | | | |
|---|---|---|---|---|
| CN | 101441351 A | 5/2009 | | |
| WO | WO-2016187984 A1 * | 12/2016 | ........... | H04N 13/359 |

* cited by examiner

DISPLAY DEVICE HAVING BOTH ORGANIC ELECTROLUMINESCENT DISPLAY PANEL AS BACKLIGHT SOURCE AND LIQUID CRYSTAL DISPLAY PANEL

CROSS-REFERENCE TO RELATED DISCLOSURE

The present disclosure claims the benefit of Chinese Patent Application Invention No. 201711364065.4 filed on Dec. 18, 2017, in China National Intellectual Property Administration, the whole disclosure of which is incorporated herein by reference.

BACKGROUND OF THE DISCLOSURE

Field of the Disclosure

Embodiments of the present disclosure relate to the field of display technology, and especially to a display device.

Description of the Related Art

With a continuous increase in users' requirements, a self-luminous display device having an advantage of relatively high contrast, e.g., an OLED (Organic Light-Emitting Diode) display device, may provide an improved quality in display, such that it becomes mainstream display technology. However, the OLED device is restricted in application due to a technical problem of difficulty in implementing a relatively high PPI (Pixels Per Inch, representing the number of pixels per inch area) thereof, and thus may be difficult in replacing completely a relevant LCD (i.e., Liquid crystal display) device of a relatively high PPI.

The OLED device comprises a plurality of pixels arranged in an array, and each pixel comprises sub-pixels which are configured to be stimulated to emit light rays of different colors so as to implement a full-color display. Since the OLED device manufactured in mass production may be restricted by a process of preparing a material of a light-emitting layer of sub-pixels, then, upon preparation thereof, it is still required to take advantage of FFM (Fine Metal Mask) technology; in other words, specifically, above all, an area of sub-pixels of a certain color to be displayed is exposed from an opening area on the FFM; and then, a corresponding material of the light-emitting layer may be deposited within the area of sub-pixels of the certain color by evaporation or ink-jet printing; meanwhile, sub-pixels of other colors may be shielded by shielding areas of the FFM having no opening therethrough, so as to complete a sequential deposition of materials of light-emitting layers of sub-pixels of various colors.

It is apparent that, an area of each sub-pixel is directly defined or delimited by a size of an opening of FMM. As a requirement of PPI has been increased gradually, the area of each single sub-pixel gradually decreases, and thus it is also required that the size of the opening should be decreased adaptively.

SUMMARY OF THE DISCLOSURE

The embodiments of the present disclosure have been made to overcome or alleviate at least one aspect of the above mentioned disadvantages and/or shortcomings in the prior art, by providing a display device.

Following technical solutions are adopted in exemplary embodiments of the disclosure for achieving the above desired technical purposes.

According to an aspect of the exemplary embodiment of the present disclosure, there is provided a display device, comprising: a liquid crystal display panel; and an organic electroluminescent display panel provided opposite to the liquid crystal display panel and configured to function as a backlight source for the liquid crystal display panel; the liquid crystal display panel has a display region defined therein, and comprises a plurality of pixel units arranged in an array and located in the display region, each of the plurality of pixel units comprising a plurality of sub-pixel units; the organic electroluminescent display panel has a light-emitting region defined therein and opposite to the display region, and comprises a plurality of light-emitting units arranged in an array and located in the light-emitting region, each of the plurality of light-emitting units comprising a plurality of light-emitting sub-units; and an area of each of the plurality of sub-pixel units is smaller than an area of a corresponding one of the plurality of light-emitting sub-units at least partially overlapping therewith.

According to an embodiment of the disclosure, the plurality of the pixel units and the plurality of light-emitting units are provided in one-to-one correspondence with each other, and each of the plurality of the pixel units has an area identical to that of each of the plurality of light-emitting units; the area of each of the plurality of sub-pixel units is equal to 1/2 of the area of each of the plurality of light-emitting sub-units; and each of the plurality of light-emitting sub-units is provided corresponding to two corresponding sub-pixel units of the plurality of sub-pixel units.

According to an embodiment of the disclosure, in each of the plurality of pixel units, the plurality of sub-pixel units comprise: a first sub-pixel unit, a second sub-pixel unit, a third sub-pixel unit and a fourth sub-pixel unit; in each of the plurality of light-emitting units, the plurality of light-emitting sub-units comprise: a first light-emitting sub-unit configured to emit a first light, and a second light-emitting sub-unit configured to emit a second light; the first light-emitting sub-unit is arranged corresponding to the first sub-pixel unit and the second sub-pixel unit to transmit the first light through the first sub-pixel unit and the second sub-pixel unit respectively, and then to display a first color and a second color respectively; the second light-emitting sub-unit is arranged corresponding to the third sub-pixel unit and the fourth sub-pixel unit to transmit the second light through the third sub-pixel unit and the fourth sub-pixel unit respectively, and then to display a third color and a fourth color respectively.

According to an embodiment of the disclosure, the first sub-pixel unit and the second sub-pixel unit are a red sub-pixel unit and a green sub-pixel unit, respectively, and the third sub-pixel unit and the fourth sub-pixel unit are a blue sub-pixel unit and a white sub-pixel unit, respectively; the first light-emitting sub-unit is a yellow light-emitting sub-unit and the first light is thus a yellow light; and the second light-emitting sub-unit is a white light-emitting sub-unit and the second light is thus a white light.

According to an embodiment of the disclosure, the first sub-pixel unit and the second sub-pixel unit are a red sub-pixel unit and a blue sub-pixel unit, respectively, and the third sub-pixel unit and the fourth sub-pixel unit are a green sub-pixel unit and a white sub-pixel unit, respectively; the first light-emitting sub-unit is a violet light-emitting sub-unit and the first light is thus a violet light; and the second light-emitting sub-unit is a white light-emitting sub-unit and the second light is thus a white light.

According to an embodiment of the disclosure, the first sub-pixel unit and the second sub-pixel unit are a green sub-pixel unit and a blue sub-pixel unit, respectively, and the third sub-pixel unit and the fourth sub-pixel unit are a red sub-pixel unit and a white sub-pixel unit, respectively; the first light-emitting sub-unit is a cyan light-emitting sub-unit and the first light is thus a cyan light; and the second light-emitting sub-unit is a white light-emitting sub-unit and the second light is thus a white light.

According to an embodiment of the disclosure, the first sub-pixel unit and the second sub-pixel unit are a red sub-pixel unit and a green sub-pixel unit, respectively, and the third sub-pixel unit and the fourth sub-pixel unit are a blue sub-pixel unit and a yellow sub-pixel unit, respectively; the first light-emitting sub-unit is a yellow light-emitting sub-unit and the first light is thus a yellow light; and the second light-emitting sub-unit is a white light-emitting sub-unit and the second light is thus a white light.

According to an embodiment of the disclosure, the first sub-pixel unit and the second sub-pixel unit are a red sub-pixel unit and a blue sub-pixel unit, respectively, and the third sub-pixel unit and the fourth sub-pixel unit are a green sub-pixel unit and a yellow sub-pixel unit, respectively; the first light-emitting sub-unit is a violet light-emitting sub-unit and the first light is thus a violet light; and the second light-emitting sub-unit is a yellow light-emitting sub-unit and the second light is thus a yellow light.

According to an embodiment of the disclosure, the first sub-pixel unit and the second sub-pixel unit are a green sub-pixel unit and a blue sub-pixel unit, respectively, and the third sub-pixel unit and the fourth sub-pixel unit are a red sub-pixel unit and a yellow sub-pixel unit, respectively; the first light-emitting sub-unit is a cyan light-emitting sub-unit and the first light is thus a cyan light; and the second light-emitting sub-unit is a yellow light-emitting sub-unit and the second light is thus a yellow light.

According to an embodiment of the disclosure, the area of each of the plurality of sub-pixel units is smaller than an area of a corresponding one of the plurality of light-emitting sub-units overlapping therewith, and an area of each of the plurality of pixel units is smaller than an area of a corresponding one of the plurality of light-emitting units overlapping therewith; and wherein each of the plurality of light-emitting sub-units is a white light-emitting sub-unit emitting a white light.

According to an embodiment of the disclosure, the organic electroluminescent display panel is an Active-Matrix driving type organic electroluminescent display panel, which further comprises a driving unit configured to drive each of the plurality of light-emitting sub-units to emit light.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION OF EMBODIMENTS OF THE DISCLOSURE

Figure 1:
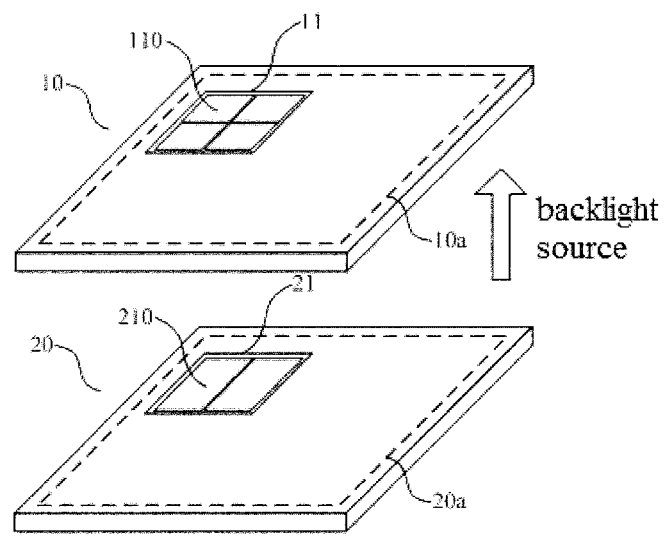
FIG. 1 illustrates a schematic structural view of a display device according to an embodiment of the disclosure.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings re only intended to exemplarily illustrate the contents of the disclosure, rather than to demonstrate the practical dimension or proportion of components of a display device.

It should be pointed out that, unless otherwise defined, all technical terms used in the embodiments of the present disclosure are intended to be understood in an ordinary meaning thereof commonly known by those skilled in the art. And it should also be understood that, those terms which are typically defined in dictionary should be interpreted to have a meaning consistent with a meaning thereof in a context of a relevant art, rather than being interpreted in an ideal sense or in an extremely formalized sense, otherwise being defined clearly herein.

For example, the terms "first", "second," and similar terms used in the specification and claims of the present disclosure do not denote any order, quantity, or importance, but are merely used to distinguish different components. The wording "include", "comprise" or the like are intended to mean that the elements or items that precedes the wording include the element(s) or the item(s) and equivalents thereof listed after the wording, without excluding other element(s) or item(s). "Upper/top", "lower/bottom" and the like are only used to indicate an orientational relationship or a positional relationship based on that as illustrated, only intending to facilitate a simplified depiction of a technical solution of the present application, rather than indicating or implying that a device or element which is referred to has to be arranged a certain orientation, or has to be constructed and operated at a certain orientation; therefore, such an expression may not be considered to be a limitation of the present application. For example, in certain conditions, an embodiment concerning "row direction" may also be implemented in a context of "column direction", and the like, and vice versa. The solution of the present application may still fall within a scope of the protection after being subject to a rotational operation at 90° or a mirroring operation.

According to a general technical concept of embodiments of the present disclosure, as is shown in FIG. 1, a display device is provided in the embodiments of the disclosure, comprising: a liquid crystal display panel 10, and an organic electroluminescent display panel 20 provided opposite to the liquid crystal display panel 10 and configured to function as a backlight source for the liquid crystal display panel 10; the liquid crystal display panel is provided with a display region 10a defined therein, and for example may be further alternatively provided with a first bezel which is located at a periphery of the liquid crystal display panel 10 and configured to delimit/define the display region 10a; and the display region 10a of the liquid crystal display panel 10 further comprises a plurality of pixel units 11 arranged in an array and located in the display region 10a, each of the plurality of pixel units 11 comprising a plurality of sub-pixel units 110; the organic electroluminescent display panel 20 has a light-emitting region 20a defined therein and opposite to the display region 10a, and for example may further alternatively have a second bezel which is located at a periphery of the organic electroluminescent display panel 20 and configured to delimit/define the light-emitting region 20a; and the light-emitting region 20a of the organic electroluminescent display panel 20 further comprises a plurality of light-emitting units 21 arranged in an array and located in the light-emitting region 20a, each of the plurality of light-emitting units 21 comprising a plurality of light-emitting sub-units 210; and an area of each of the plurality of sub-pixel units 110 is smaller than an area of a corresponding one of the plurality of light-emitting sub-units 210 at least partially overlapping therewith.

In order to understand the embodiment of the disclosure in a clearer and better way, technical terms according to the embodiments of the disclosure comprising the display region 10a and the like, which are involved by the display device as above, are further set forth in detail hereinafter.

The display region 10a of the liquid crystal display panel 10 (abbreviated as LCD panel) is a region of the LCD panel in which images may be displayed.

The LCD panel is formed by a first substrate and a second substrate aligned and assembled with each other, and a liquid crystal layer encapsulated between the first substrate and the second substrate.

Typically, the first substrate is a color film substrate on which a plurality of color filter blocks of various colors arranged in an array are formed and configured to pass light being incident onto the color film substrate therethrough to present a certain color after further passing through the color filter blocks; the second substrate is an array substrate on which TFT (Thin Film Transistor) switches, pixel electrodes and a common electrode are arranged in an array and configured to drive liquid crystal molecules within the liquid crystal layer to deflect so as to implement a selective transmission of light therethrough from the organic electroluminescent display panel 20.

A sub-pixel unit may be formed, by each color filter block presenting a single color and located on the color film substrate, and a TFT, a pixel electrode and the common electrode which are provided corresponding to (e.g., at least partially overlapping with each other) the color filter block and located on the array substrate (e.g., which is located below the color film substrate, as illustrated), as well as liquid crystal molecules provided in a portion of the liquid crystal layer between the color filter block and the TFT, the pixel electrode and the common electrode, collectively. Each sub-pixel unit displays light of merely one color, i.e., it functions as a minimal display unit on the LCD panel.

In order to ensure that a full-color display may be implemented by the LCD panel, it is required to utilize a color mixture of spaces of three primary colors (typically red, blue and green). Specifically, by using several sub-pixel units 110 presenting different colors respectively, an even larger functional unit, which may implement a functionality of carrying out an operation of the color mixture, may thus be constructed in a certain arrangement, i.e., a pixel-unit 11 is thus formed.

The light-emitting region 20a of the organic electroluminescent display panel 20 (abbreviated as OLED panel hereinafter) refers to an overall region on the whole OLED panel, which may emit light autonomously. Since in the display device having above specific architecture according to the embodiment of the disclosure, the OLED panel functions as the backlight source of the LCD panel, then the light-emitting region 20a and the display region 10a of the liquid crystal display panel 10 are provided to face exactly and just directly towards each other, and thus patterns of both regions are provided to be identical to and consistent with each other.

Each of the plurality of light-emitting sub-units 210 of the OLED panel is an OLED device; in other words, each OLED device may emit light of a single color, and thus functions as a minimal light-emitting unit of the OLED panel. The plurality of light-emitting sub-units 210 (e.g., emitting light rays of a same color or different colors) may be provided in a certain arrangement to construct an even larger unit, i.e., a light-emitting unit 21. In a condition that above OLED panel functions as a relevant display panel which emits light autonomously, then the plurality of light-emitting sub-units are sub-pixels of the OLED panel, and in turn the plurality of light-emitting units 21 are pixels of the OLED panel.

It should be noticed that, above display device are formed by alignment and assembly of the LCD panel functioning as the display panel and the OLED panel functioning as the backlight source, in a face-to-face manner, and above FIG. 1 is merely an disassembled schematic view.

FIG. 1 merely illustrates schematically both number and arrangement of exemplary sub-pixel units 110 in each pixel unit 11 and both number and arrangement of exemplary light-emitting sub-units 210 in each light-emitting unit 21, as long as an area of each sub-pixel unit 110 (i.e., the minimal display unit) of the LCD panel is smaller than an area of a corresponding light-emitting sub-unit 210 (i.e., the minimal light-emitting unit) of the OLED panel which is at least partially overlapping therewith, without being limited in terms of both specific number and arrangement thereof in the embodiment of the disclosure.

Based on the above, by the display device as provided in above embodiment of the disclosure, in order to implement a high PPI display quality of images thereby, for example, the sub-pixel units of the LCD panel may be designed to be placed in an arrangement of a relatively high PPI value, i.e., an area of each sub-pixel unit is relatively small. And during a preparation of the OLED panel, since the area of each sub-pixel unit in the LCD panel which functions as the display panel is smaller than the area of the corresponding light-emitting sub-unit, which is at least partially overlapping therewith, in the OLED panel which functions as the backlight source; in other words, the corresponding light-emitting sub-unit which is at least partially overlapping therewith has a relatively larger area than that of the sub-pixel unit, then, in at least a portion of region, e.g., a FMM having even larger opening area thereon may be used to prepare the light emitting layer, so as to at least alleviate adverse effects in preparation, rinsing/cleaning, alignment, and expansion and the like due to excessively small areas of opening of FMM, and in turn enhancing production yield rate, while decreasing cost.

In addition, by taking advantage of the OLED panel as the backlight source, the display panel formed by alignment and assembly may be provided with an advantage of an ultra-high contrast during display.

In a further embodiment, above OLED panel is an Active Matrix (abbreviated as AM) type organic electroluminescent display panel, and the OLED panel further comprises: a driving unit (or driving units) configured to drive each of the plurality of light-emitting sub-units to emit light.

The driving unit may for example be constructed in a "2T1C" structure, i.e., each light-emitting sub-unit 210 is equipped with two TFTs and one storage capacitor, and is specifically constructed to be a structure of a driving unit which follows relevant art and comprises TFT(s) and storage capacitor(s), without any revision or improvement thereto in the embodiment of the disclosure.

Based on the above, in order to further break through an existing technical bottleneck of the difficulty in implementing a relatively high PPI of the OLED panel, and to increase the opening area of the FMM by 2 times, i.e., the area of each of the plurality of sub-pixel units 110 of the LCD panel is smaller than the area of each of the plurality of light-emitting sub-units 210 of the OLED panel.

In a further embodiment of the disclosure, there may be corresponding proportional relationships among the plurality of pixel units 11 and the plurality of sub-pixel units 110 of the LCD panel, and the plurality of light-emitting units 21 and the plurality of light-emitting sub-units 210 of the OLED panel, as follows:

Referring to FIG. 1, the plurality of the pixel units 11 of the LCD panel and the plurality of light-emitting units 21 of the OLED panel are provided in one-to-one correspondence with (e.g., arranged to be aligned with) each other, and each of the plurality of the pixel units 11 has an area identical to that of each of the plurality of light-emitting units 21; the area of each of the plurality of sub-pixel units 110 is equal to 1/2 of the area of each of the plurality of light-emitting sub-units 210; and each of light-emitting sub-units 210 is provided corresponding to (e.g., arranged to be aligned with or to be overlapping with) two corresponding sub-pixel units of the plurality of sub-pixel units 110.

In other words, there may be fixed integer proportional relations among densities of distribution of various types of units as above, facilitating a design of the panel, specifically, for example being:

PPI of each of the plurality of sub-pixel units 110 in the display region 10a is larger than PPI of each of the plurality of light-emitting sub-units 210 in the light-emitting region 20a; and PPI of each of the plurality of pixel units 11 in the display region 10a is equal to PPI of each of the plurality of light-emitting units 21 in the light-emitting region 20a.

And by way of example, colors of the plurality of sub-pixel units 110 of the LCD panel and colors of the plurality of light-emitting sub-units 210 of the corresponding OLED panel, are configured to meet a design principle of complementary color mixture, as follows:

As illustrated, in each pixel unit, in each of the plurality of pixel units 11, the plurality of sub-pixel units 110 com- prise: a first sub-pixel unit, a second sub-pixel unit, a third sub-pixel unit and a fourth sub-pixel unit; and in each of the plurality of light-emitting units 21, the plurality of light-emitting sub-units 210 comprise: a first light-emitting sub-unit configured to emit a first light, and a second light-emitting sub-unit configured to emit a second light. The first light-emitting sub-unit is arranged corresponding to (e.g., aligned with or overlapping with) the first sub-pixel unit and the second sub-pixel unit to transmit the first light through the first sub-pixel unit and the second sub-pixel unit respectively, and then to display a first color and a second color respectively; and the second light-emitting sub-unit is arranged corresponding to (e.g., aligned with or overlapping with) the third sub-pixel unit and the fourth sub-pixel unit to transmit the second light through the third sub-pixel unit and the fourth sub-pixel unit respectively, and then to display a third color and a fourth color respectively.

In other words, a correspondence relationship between colors of the sub-pixel units 110 of the LCD panel and corresponding light-emitting sub-units 210 of the OLED panel may be set, specifically for example as follows: wavebands of the first light comprise wavebands corresponding to colored lights of the first color and the second color different from each other, respectively; for example, the first light comprises two types of colored lights which have different wavebands respectively and present the first color and the second color respectively, as such, in a condition that the liquid crystal molecules in the sub-pixel unit are deflected to allow backlight emitted by the backlight source to pass therethrough, the first light functioning as a portion of the backlight may pass through the first sub-pixel unit and the second sub-pixel unit respectively, and then to display the first color and the second color different from each other respectively. Similarly, wavebands of the second light comprise wavebands corresponding to colored lights of the third color and the fourth color different from each other, respectively; for example, the second light comprises two types of colored lights which have different wavebands respectively and present the third color and the fourth color respectively, as such, in a condition that the liquid crystal molecules in the sub-pixel unit are deflected to allow backlight emitted by the backlight source to pass therethrough, the second light functioning as another portion of the backlight may pass through the third sub-pixel unit and the fourth sub-pixel unit respectively, and then to display the third color and the fourth color different from each other respectively.

Furthermore, in relevant art, in order to overcome the technical limitation that it may be difficult to implement the FMM directly on the OLED panel having a relatively high PPI, e.g., it is provided a compromised alternative solution comprising a combination between a white light OLED panel and a color film layer to implement a display effect of high PPI. In this way, OLED devices in the white light OLED panel which emit a white light are prepared as a whole layer, without any process of FMM. However, since a white light may for example be formed by a mixture among a red light, a green light and a blue light, then, once the white light emitted from the white light OLED panel passes through the color film layer, merely about 1/3 of the light may transmit through corresponding red color filter block(s), green color filter block(s) and blue color filter block(s) on the color filter layer so as to present a red monochromatic light, a green monochromatic light and a blue monochromatic light, respectively; while most of the light (i.e., approximately 2/3; in other words, about 66.67%)

may be filtered out by the color film layer, resulting in a dramatic growth in power consumption.

In view of this, in the display device as above according to the embodiment of the disclosure, a utilization rate/efficiency of the backlight emitted from the OLED panel by the LCD panel, may be further improved with a decreased power consumption, by the above correspondence relationship between colors of the sub-pixel units 110 of the LCD panel and corresponding light-emitting sub-units 210 of the OLED panel.

It should be noticed that, since a metallic material may typically be selected to form a cathode of an OLED device, a reflected light may be generated by an ambient light being incident on to a surface of the OLED device, resulting in an effect on a contrast of the OLED panel. Therefore, in a relevant art, a circular polarizer is typically carried on a light-emergent side of the OLED panel so as to resist effectively any interference of the ambient light.

In a LCD panel, since most of the liquid crystal molecules therein may only allow light passing through the polarizer to transmit therethrough, then, correspondingly, a upper polarizer and a lower polarizer may be provided on both sides of the LCD panel, respectively so as to filter out light crosstalk.

Since in both relevant art and the embodiment of the disclosure, in both the OLED panel and the LCD panel, there are polarizers, respectively, and in the relevant art, a loss in light out-coupling efficiency at the OLED panel caused by the polarizer may be (substantially) the same as that at the LCD panel caused by the polarizer. In order to simplify not only a comparison between a light loss rate of a design scheme in the relevant art comprising the white light OLED panel and the color film layer and a light loss rate of above display device according to the embodiment of the disclosure, but also computations thus involved therein, without effects on the light out-coupling efficiencies of various panels as applied by the polarizer(s) being taken into account in results of the computations concerning both the light out-coupling efficiency of "1/3" as above and other light out-coupling efficiency as to be mentioned hereinafter.

Six specific embodiments are provided hereinafter, so as to set forth in detail the specific correspondence relationship between colors of the LCD panel and the OLED panel.

Exemplary Embodiment

Figure 2:
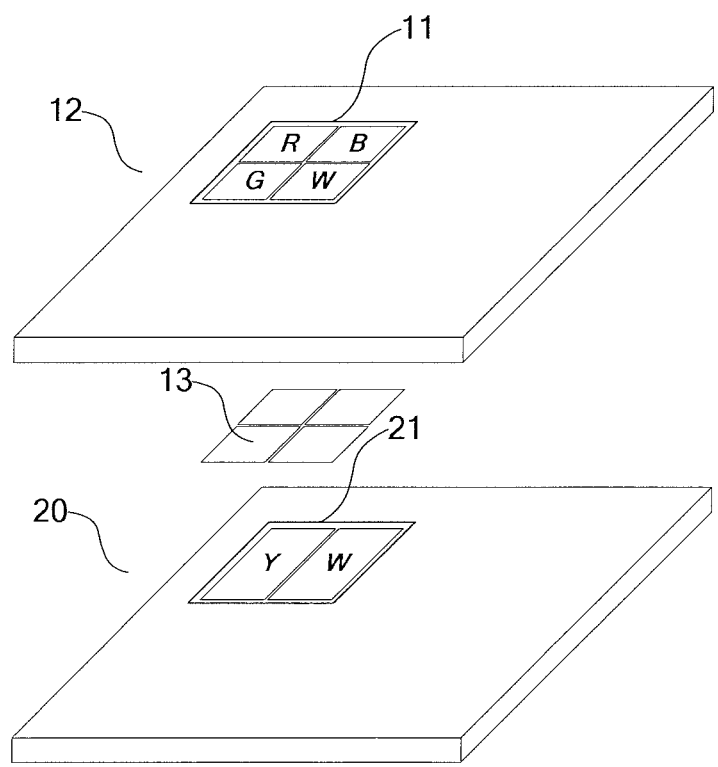
FIG. 2 illustrates a schematic local structural view of a display device according to an embodiment of the disclosure.

As illustrated in FIG. 2, in the LCD panel, by way of example, the first sub-pixel unit and the second sub-pixel unit are a red sub-pixel unit (labeled by "R" as illustrated, i.e., Red) and a green sub-pixel unit (labeled by "G" as illustrated, i.e., Green), respectively, and the third sub-pixel unit and the fourth sub-pixel unit are a blue sub-pixel unit (labeled by "B" as illustrated, i.e., Blue) and a white sub-pixel unit (labeled by "W" as illustrated, i.e., White), respectively; in the OLED panel, the first light-emitting sub-unit is a yellow light-emitting sub-unit (labeled by "Y" as illustrated, i.e., Yellow) and the first light emitted therefrom is thus a yellow light (which comprising wavebands of both a red light and a green light); and the second light-emitting sub-unit is a white light-emitting sub-unit (labeled by "W" as illustrated) and the second light emitted therefrom is thus a white light (which comprising wavebands of both a blue light and a white light).

It should be noticed that, it should be taken into consideration that a pixel algorithm for the LCD panel is typically calculated in an arrangement manner of R/G/B/W or R/G/B/Y, then, in order to ensure that the display device provided by the embodiment and other display device(s) provided in following embodiment may be more readily compatible with relevant pixel algorithm for the LCD panel, then, by way of example, in the embodiment and the following embodiment, various sub-pixel units in the LCD panel may be set in an arrangement manner of R/G/B/W or R/G/B/Y, and depending on the arrangement manner of colors, colors of specific light emitted by the plurality of light-emitting sub-units in the OLED panel may be set as follows.

However, the embodiment and embodiments hereinafter of the disclosure may not be limited thereto, and furthermore in the LCD panel, alternatively, another sub-pixel unit in addition to R/G/B may for example be a sub-pixel unit of another color such as cyan, violet and the like except for white; and therefore, in the OLED panel, colors of specific lights emitted by the plurality of light-emitting sub-units respectively may be adjusted flexibly depending on the principle of complementary color mixture.

For clarity, in above FIG. 2 and schematic structural views of the display device according to following embodiment, merely one pixel unit 11 and one light-emitting unit 21 are illustrated; moreover, in order to better present an arrangement manner of various colors for complementary color mixture thereamong, a color film substrate 12 in the LCD panel is further illustrated exemplarily, and the color filter blocks of various colors on the color filter substrate 12 are marked correspondingly as R, G, B, W (or Y) and the like. Furthermore, specific regions of liquid crystal molecules 13 corresponding to these color filter blocks in various sub-pixel units are schematically illustrated, so as to better set forth specific effects of the liquid crystal molecules functioning as switches in the embodiment of the disclosure.

Figure 3:
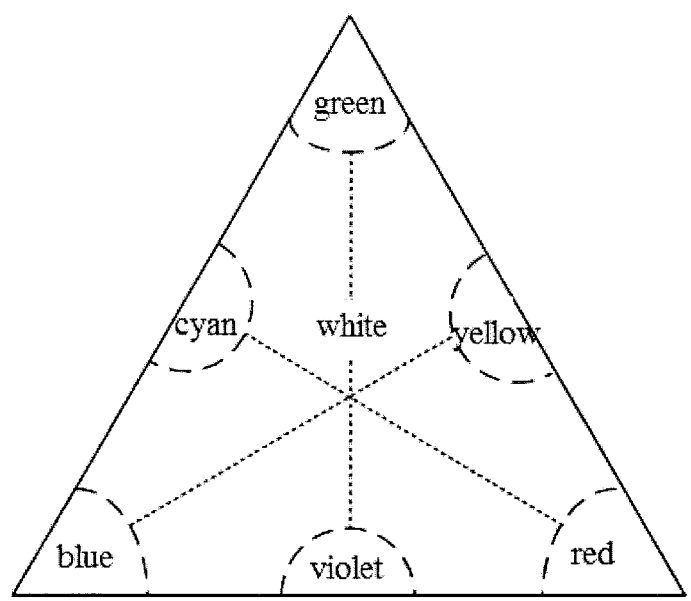
FIG. 3 illustrates a schematic principle diagram of a colored triangle implemented by an additive color mixture, on the basis of a complementary color mixture of various colors.

As to a light of any one color in a spectrum, there may correspondingly be at least one light of another color(s) such that these different color lights (e.g., a pair of these two colors are taken as an example herein) may be mixed with each other in a certain proportion therebetween so as to obtain a white light, then the pair of color lights may be referred to as complementary color lights, such as, red and cyan, green and violet, blue and yellow. The mixture of color lights in the spectrum is an additive color mixture (i.e., a color mixture by addition), with a principle of complementary color mixture among various colors as illustrated in FIG. 3, with a result of the additive color mixture which may for example be expressed by simple equations listed as below:

Red+Green=Yellow;

Red+Blue=Violet;

Blue+Green=Cyan; and

Red+Green+Blue=White.

Based on the principle of the complementary color mixture implemented by additive color mixture as above, in above display device provided in the embodiment, the yellow light emitted by the yellow light-emitting sub-units of the OLED panel passes through the red sub-pixel unit above all, and then a color light of the green light wavebands which is contained in the yellow light may be filtered out by the red filter block(s) (located on the color film substrate) in the red sub-pixel unit, and only a red light is presented therefrom finally, i.e., as to the red sub-pixel unit, it has a light utilization efficiency of approximately 1/2, for the first light which is the yellow light; similarly, a color light of the red light wavebands which is contained in the yellow light emitted by the yellow light-emitting sub-units may filtered out by the green sub-pixel unit, and only a green light is presented therefrom finally, i.e., as to the green sub-pixel unit, it also has a light utilization efficiency of approximately 1/2, for the first light which is the yellow light.

The blue sub-pixel unit requires to filter out two color lights of the red light wavebands and the green light wavebands respectively both of which are contained in the white light emitted by a white light-emitting sub-unit arranged corresponding thereto (e.g., aligned or overlapping with each other), then, the blue sub-pixel unit has a light utilization efficiency of approximately 1/3, for the second light which is the white light. The white color filter block(s) (located on the color film substrate) in the white sub-pixel unit is transparent and thus may substantially cause almost no loss to the white light which is emitted by the white light-emitting sub-unit and passes therethrough; then, the white sub-pixel unit has a light utilization efficiency of approximately 1, for the second light which is the white light.

Then, by an integrative computation of above results, it may be known that, with the display device whose pixels are provided in the arrangement manner as in the embodiment as above, then the LCD panel may have an integral light utilization efficiency of approximately 7/12 for the light emitted by the OLED panel; to be specific, the integral light utilization efficiency may be obtained, by an addition of light utilization efficiencies of each type of pixel units, i.e., $(1/2+1/2+1/3+1)/(1+1+1+1)=7/12$. That is to say, the integral light loss rate is approximately $1-7/12=5/12$ (41.67%), which is lower than a light loss rate of the design scheme in the relevant art comprising the white light OLED panel and the color film layer.

Another Exemplary Embodiment

Figure 4:
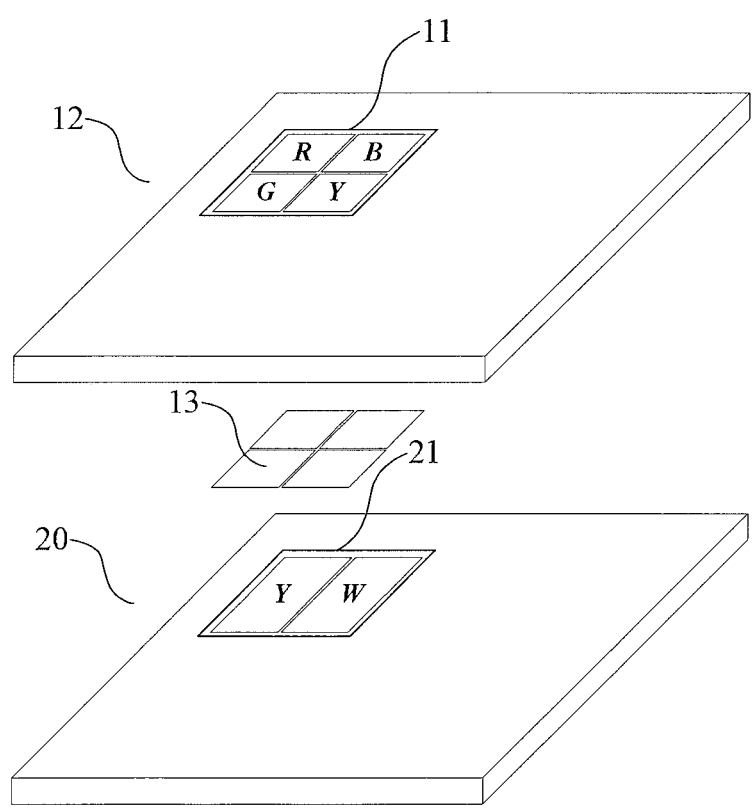
FIG. 4 illustrates a schematic local structural view of a display device according to another embodiment of the disclosure.

As illustrated in FIG. 4, in the LCD panel, by way of example, the first sub-pixel unit and the second sub-pixel unit are a red sub-pixel unit (labeled by "R" as illustrated) and a green sub-pixel unit (labeled by "G" as illustrated), respectively, and the third sub-pixel unit and the fourth sub-pixel unit are a blue sub-pixel unit (labeled by "B" as illustrated) and a yellow sub-pixel unit (labeled by "Y" as illustrated), respectively; in the OLED panel, the first light-emitting sub-unit is a yellow light-emitting sub-unit (labeled by "Y" as illustrated) and the first light emitted therefrom is thus a yellow light; and the second light-emitting sub-unit is a white light-emitting sub-unit (labeled by "W" as illustrated) and the second light emitted therefrom is thus a white light.

The principle of complementary color mixture refers to above, without being repeated herein any more.

Based on the principle of the complementary color mixture implemented by additive color mixture as above, in above display device provided in the another embodiment, the yellow light emitted by the yellow light-emitting sub-units of the OLED panel passes through the red sub-pixel unit above all, and then a color light of the green light wavebands which is contained in the yellow light may be filtered out by the red filter block(s) (located on the color film substrate) in the red sub-pixel unit, and only a red light is presented therefrom finally, i.e., as to the red sub-pixel unit, it has a light utilization efficiency of approximately 1/2, for the first light which is the yellow light; similarly, a color light of the red light wavebands which is contained in the yellow light emitted by the yellow light-emitting sub-units may filtered out by the green sub-pixel unit, and only a green light is presented therefrom finally, i.e., as to the green sub-pixel unit, it also has a light utilization efficiency of approximately 1/2, for the first light which is the yellow light.

The blue sub-pixel unit requires to filter out two color lights of the red light wavebands and the green light wavebands respectively both of which are contained in the white light emitted by a white light-emitting sub-unit arranged corresponding thereto (e.g., aligned or overlapping with each other), then, the blue sub-pixel unit has a light utilization efficiency of approximately 1/3, for the second light which is the white light. And since the blue light and the yellow light are a pair of complementary color lights, then the yellow sub-pixel unit requires to filter out merely a color light of the blue light wavebands which is contained in the white light emitted by a white light-emitting sub-unit arranged corresponding thereto, then, the yellow sub-pixel unit has a light utilization efficiency of approximately 1/2, for the second light which is the white light.

Then, by an integrative computation of above results, it may be known that, with the display device whose pixels are provided in the arrangement manner as in the another embodiment, then the LCD panel may have an integral light utilization efficiency of approximately 11/24 for the light emitted by the OLED panel; to be specific, the integral light utilization efficiency may be obtained, by an addition of light utilization efficiencies of each type of pixel units, i.e., $(1/2+1/2+1/3+1/2)/(1+1+1+1)=11/24$. That is to say, the integral light loss rate is approximately $1-11/24=13/24$ ($\approx 54.17\%$), which is also lower than a light loss rate of the design scheme in the relevant art comprising the white light OLED panel and the color film layer.

Still Another Exemplary Embodiment

Figure 5:
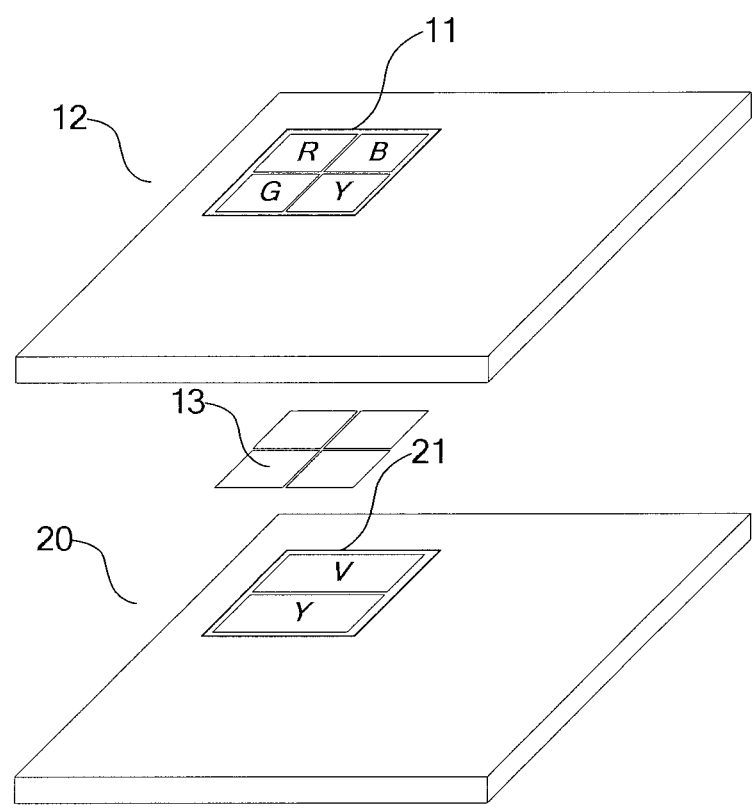
FIG. 5 illustrates a schematic local structural view of a display device according to still another embodiment of the disclosure.

As illustrated in FIG. 5, in the LCD panel, by way of example, the first sub-pixel unit and the second sub-pixel unit are a red sub-pixel unit (labeled by "R" as illustrated) and a blue sub-pixel unit (labeled by "B" as illustrated), respectively, and the third sub-pixel unit and the fourth sub-pixel unit are a green sub-pixel unit (labeled by "G" as illustrated) and a yellow sub-pixel unit (labeled by "Y" as illustrated), respectively; in the OLED panel, the first light-emitting sub-unit is a violet light-emitting sub-unit (labeled by "V" as illustrated, i.e., Violet) and the first light emitted therefrom is thus a violet light; and the second light-emitting sub-unit is a yellow light-emitting sub-unit (labeled by "Y" as illustrated) and the second light emitted therefrom is thus a yellow light.

Based on the principle of the complementary color mixture implemented by additive color mixture as above, in above display device provided in the still another embodiment, the violet light emitted by the violet light-emitting sub-units of the OLED panel passes through the red sub-pixel unit above all, and then a color light of the blue light wavebands which is contained in the violet light may be filtered out by the red filter block(s) (located on the color film substrate) in the red sub-pixel unit, and only a red light is presented therefrom finally, i.e., as to the red sub-pixel unit, it has a light utilization efficiency of approximately 1/2, for the first light which is the violet light; similarly, a color light of the red light wavebands which is contained in the violet light emitted by the violet light-emitting sub-units may be filtered out by the blue sub-pixel unit, and only a blue light is presented therefrom finally, i.e., as to the blue sub-pixel unit, it also has a light utilization efficiency of approximately 1/2, for the first light which is the violet light.

The green sub-pixel unit requires to filter out merely a color light of the red light wavebands which is contained in the yellow light emitted by a yellow light-emitting sub-unit arranged corresponding thereto, then, the green sub-pixel unit has a light utilization efficiency of approximately 1/2, for the second light which is the yellow light. The color filter block(s) (located on the color film substrate) in the yellow sub-pixel unit is in a color of yellow, and thus may substantially cause almost no loss to the yellow light which is emitted by the yellow light-emitting sub-unit and passes therethrough; then, the yellow sub-pixel unit has a light utilization efficiency of approximately 1, for the second light which is the yellow light.

Then, by an integrative computation of above results, it may be known that, with the display device whose pixels are provided in the arrangement manner as in the still another embodiment, then the LCD panel may have an integral light utilization efficiency of approximately 5/8 for the light emitted by the OLED panel; to be specific, the integral light utilization efficiency may be obtained, by an addition of light utilization efficiencies of each type of pixel units, i.e., $(1/2+1/2+1/2+1/2)/(1+1+1+1)=5/8$. That is to say, the integral light loss rate is approximately $1-5/8=3/8$ ($\approx 37.50\%$), which is still significantly lower than a light loss rate of the design scheme in the relevant art comprising the white light OLED panel and the color film layer.

Here, referring to the schematic principle diagram of a complementary color mixture of various colors as illustrated in FIG. 3, in the LCD panel, the third sub-pixel unit and the fourth sub-pixel unit may also for example be a green sub-pixel unit and a cyan sub-pixel unit (the cyan color and the yellow color are located on both sides of the green color as illustrated, respectively, both comprising a green portion therein, respectively); accordingly, in the OLED panel, the second light-emitting sub-unit is for example a cyan light-emitting sub-unit and thus the second light is a cyan light. The integral light utilization efficiency is also approximately 5/8, without repeating specific principle thereof any more, and said still another embodiment only provides an exemplary solution as above.

Yet Another Exemplary Embodiment

In the LCD panel, by way of example, the first sub-pixel unit and the second sub-pixel unit are a red sub-pixel unit and a blue sub-pixel unit, respectively, and the third sub-pixel unit and the fourth sub-pixel unit are a green sub-pixel unit and a white sub-pixel unit, respectively; in the OLED panel, the first light-emitting sub-unit is a violet light-emitting sub-unit and the first light emitted therefrom is thus a violet light; and the second light-emitting sub-unit is a white light-emitting sub-unit and the second light emitted therefrom is thus a white light.

Referring to the principle of the complementary color mixture implemented by additive color mixture as above, in the yet another embodiment, each of the red sub-pixel unit and the blue sub-pixel unit has a light utilization efficiency of approximately 1/2, for the first light which is the violet light emitted by the violet light-emitting sub-unit located below it; and the green sub-pixel unit has a light utilization efficiency of approximately 1/3 and the white sub-pixel unit has a light utilization efficiency of approximately 1, for the second light which is the white light emitted by the white light-emitting sub-unit located below them.

Then, by an integrative computation of above results, it may be known that, with the display device whose pixels are provided in the arrangement manner as in the yet another embodiment, then the LCD panel may have an integral light utilization efficiency of approximately 7/12 for the light emitted by the OLED panel; to be specific, the integral light utilization efficiency may be obtained, by an addition of light utilization efficiencies of each type of pixel units, i.e., $(1/2+1/2+1/3+1)/(1+1+1+1)=7/12$. That is to say, the integral light loss rate is approximately $1-7/12=5/12$ (41.67%), which is still lower than a light loss rate of the design scheme in the relevant art comprising the white light OLED panel and the color film layer.

Still Yet Another Exemplary Embodiment

In the LCD panel, by way of example, the first sub-pixel unit and the second sub-pixel unit are a green sub-pixel unit and a blue sub-pixel unit, respectively, and the third sub-pixel unit and the fourth sub-pixel unit are a red sub-pixel unit and a white sub-pixel unit, respectively; in the OLED panel, the first light-emitting sub-unit is a cyan light-emitting sub-unit and the first light emitted therefrom is thus a cyan light; and the second light-emitting sub-unit is a white light-emitting sub-unit and the second light emitted therefrom is thus a white light.

Referring to the principle of the complementary color mixture implemented by additive color mixture as above, in the still yet another embodiment, each of the green sub-pixel unit and the blue sub-pixel unit has a light utilization efficiency of approximately 1/2, for the first light which is the cyan light emitted by the cyan light-emitting sub-unit located below it; and the red sub-pixel unit has a light utilization efficiency of approximately 1/3 and the white sub-pixel unit has a light utilization efficiency of approximately 1, for the second light which is the white light emitted by the white light-emitting sub-unit located below them.

Then, by an integrative computation of above results, it may be known that, with the display device whose pixels are provided in the arrangement manner as in the still yet another embodiment, then the LCD panel may have an integral light utilization efficiency of approximately 7/12 for the light emitted by the OLED panel; to be specific, the integral light utilization efficiency may be obtained, by an addition of light utilization efficiencies of each type of pixel units, i.e., $(1/2+1/2+1/3+1)/(1+1+1+1)=7/12$. That is to say, the integral light loss rate is approximately $1-7/12=5/12$ ($\approx 41.67\%$), which is still lower than a light loss rate of the design scheme in the relevant art comprising the white light OLED panel and the color film layer.

Further Exemplary Embodiment

In the LCD panel, by way of example, the first sub-pixel unit and the second sub-pixel unit are a green sub-pixel unit and a blue sub-pixel unit, respectively, and the third sub-pixel unit and the fourth sub-pixel unit are a red sub-pixel unit and a yellow sub-pixel unit, respectively; in the OLED panel, the first light-emitting sub-unit is a cyan light-emitting sub-unit and the first light emitted therefrom is thus a cyan light; and the second light-emitting sub-unit is a yellow light-emitting sub-unit and the second light emitted therefrom is thus a yellow light.

Referring to the principle of the complementary color mixture implemented by additive color mixture as above, in the further embodiment, each of the green sub-pixel unit and the blue sub-pixel unit has a light utilization efficiency of approximately 1/2, for the first light which is the cyan light emitted by the cyan light-emitting sub-unit located below it;

and the red sub-pixel unit has a light utilization efficiency of approximately 1/2 and the yellow sub-pixel unit has a light utilization efficiency of approximately 1, for the second light which is the yellow light emitted by the yellow light-emitting sub-unit located below them.

Then, by an integrative computation of above results, it may be known that, with the display device whose pixels are provided in the arrangement manner as in the further embodiment, then the LCD panel may have an integral light utilization efficiency of approximately 5/8 for the light emitted by the OLED panel; to be specific, the integral light utilization efficiency may be obtained, by an addition of light utilization efficiencies of each type of pixel units, i.e., $(1/2+1/2+1/2+1)/(1+1+1+1)=5/8$. That is to say, the integral light loss rate is approximately$1-5/8=3/8$ ($\approx 37.50\%$), which is still significantly lower than a light loss rate of the design scheme in the relevant art comprising the white light OLED panel and the color film layer.

Here, also referring to the schematic principle diagram of a complementary color mixture of various colors as illustrated in FIG. 3, in the LCD panel, alternatively, the third sub-pixel unit and the fourth sub-pixel unit may also for example be a red sub-pixel unit and a violet sub-pixel unit (the yellow color and the violet color are located on both sides of the red color as illustrated, respectively, both comprising a red portion therein, respectively); accordingly, in the OLED panel, the second light-emitting sub-unit is for example a violet light-emitting sub-unit and thus the second light is a violet light. The integral light utilization efficiency is also approximately 5/8, without repeating specific principle thereof any more, and said further embodiment only provides an exemplary solution as above.

From the yet another exemplary embodiment to the further embodiment of the disclosure, they may be understood by reference to the Figures of precedent embodiments, without being repeated herein any more.

Based on the above, as to a structural design in which the area of each of the plurality of sub-pixel units 110 of the LCD panel is smaller than an area of a portion of a corresponding one of the plurality of light-emitting sub-units 210 of the OLED panel overlapping therewith, e.g., in a condition that one pixel unit 11 in the LCD panel comprises three sub-pixel units 110, there may be a specific exemplary embodiment, e.g., the three sub-pixel units comprise a red sub-pixel unit, a green sub-pixel unit and a blue sub-pixel unit, respectively; and in a condition that one light-emitting unit 21 in the LCD panel comprises two light-emitting sub-units 210, there may be a specific exemplary embodiment, e.g., the two light-emitting sub-units 210 comprise a yellow light-emitting sub-units and a white (or blue) light-emitting sub-unit, respectively.

The yellow light-emitting sub-unit is provided corresponding to both the red sub-pixel unit and the green sub-pixel unit, and an area of the yellow light-emitting sub-unit is for example equal to twice of a respective area of the red sub-pixel unit or the green sub-pixel unit. The white (or blue) light-emitting sub-unit is provided merely corresponding to the blue sub-pixel unit, and an area of the white (or blue) light-emitting sub-unit is equal to an area of the blue sub-pixel unit.

In other words, PPI of sub-pixel units of at least two colors on the LCD panel is equal to PPI of light-emitting sub-unit(s) of at least one color on the OLED panel.

Further based on the above, on the contrary, in a condition that PPI of the plurality of pixel units of the LCD panel is larger than PPI of the plurality of light-emitting units of the OLED panel, i.e., the area of a single sub-pixel unit of the LCD panel is smaller than the area of a single light-emitting unit of the OLED panel, then there may exist one light-emitting unit provided corresponding to several pixel units, and thus it may be difficult to adopt the design method by the complementary color mixture as above.

Therefore, in such a condition, each of the plurality of light-emitting sub-units 210 of the OLED panel is a white light-emitting sub-unit which emits the white light, i.e., the OLED panel is a white light OLED panel.

There are several advantageous technical effects brought about by the technical solutions as provided in embodiments of the disclosure, as compared with relevant art, as below:

Based on the above, by the display device as provided in embodiments of the disclosure, in order to implement a high PPI display quality of images thereby, for example, the sub-pixel units of the LCD panel may be designed to be placed in an arrangement of a relatively high PPI value, i.e., an area of each sub-pixel unit is relatively small. And during a preparation of the OLED panel, since the area of each sub-pixel unit in the LCD panel which functions as the display panel is smaller than the area of the corresponding light-emitting sub-unit, which is at least partially overlapping therewith, in the OLED panel which functions as the backlight source; in other words, the corresponding light-emitting sub-unit which is at least partially overlapping therewith has a relatively larger area than that of the sub-pixel unit, then, in at least a portion of region, e.g., a FMM having even larger opening area thereon may be used to prepare the light emitting layer, so as to at least alleviate to a certain degree adverse effects in preparation, rinsing/cleaning (mainly lying in increased process difficulty in processes such as sagging, tension, welding and the like) and adverse effects in alignment, and expansion and the like (such as increased difficulty in alignment during use, and deterioration of expansion problem, and the like, and in turn a phenomenon of serious color mixture of the OLED device in pursuit of a display effect of relatively high PPI), due to excessively small areas of opening of FMM, and in turn enhancing production yield rate, while decreasing cost.

Based on this, with the aforementioned display device according to the embodiments of the disclosure, by a specific alignment and assembly relationship of colors and/or sizes between the pixels of the OLED panel and the pixels of the LCD panel, it is possible to maintain the technical advantage of a self-luminous display panel and to break through the technical bottleneck in terms of PPI of a self-luminous display panel simultaneously, so as to implement a PPI thereof which is twice as many as the PPI of a relevant self-luminous display panel, with a power consumption lower than the design scheme in the relevant art comprising the white light OLED panel and the color film layer.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A display device, comprising:
   a liquid crystal display panel, comprising:
   a color film substrate on which a plurality of color filter blocks of various colors arranged in an array are formed, each of the plurality of color filter blocks presenting a single color;
   an array substrate which is aligned and assembled with the color film substrate, on which array substrate there are formed with thin film transistor switches, pixel electrodes and a common electrode all arranged in an array; and
   a liquid crystal layer encapsulated between the color film substrate and the array substrate; and
   an organic electroluminescent display panel provided opposite to the liquid crystal display panel and configured to function as a backlight source for the liquid crystal display panel,
   wherein the liquid crystal display panel has a display region defined therein, and comprises a plurality of pixel units arranged in an array and located in the display region, each of the plurality of pixel units comprising a plurality of sub-pixel units;
   each color filter block presenting a single color and located on the color film substrate, and a respective thin film transistor switch, a respective pixel electrode and the common electrode which are provided corresponding to the color filter block and located on the array substrate, as well as liquid crystal molecules provided in a respective portion of the liquid crystal layer between the color filter block and the respective thin film transistor switch, the respective pixel electrode and the common electrode cooperatively define a respective one of the plurality of sub-pixel units, collectively;
   the organic electroluminescent display panel has a light-emitting region defined therein and opposite to the display region, and comprises a plurality of light-emitting units arranged in an array and located in the light-emitting region, each of the plurality of light-emitting units comprising a plurality of light-emitting sub-units; and
   wherein an area of each of the plurality of sub-pixel units is smaller than an area of a corresponding one of the plurality of light-emitting sub-units at least partially overlapping therewith;
   wherein the plurality of the pixel units and the plurality of light-emitting units are provided in one-to-one correspondence with each other, and each of the plurality of the pixel units has an area identical to that of each of the plurality of light-emitting units;
   the area of each of the plurality of sub-pixel units is equal to 1/2 of the area of each of the plurality of light-emitting sub units; and
   each of the plurality of light-emitting sub units is provided corresponding to two corresponding sub-pixel units of the plurality of sub-pixel units;
   wherein in each of the plurality of pixel units, the plurality of sub-pixel units comprise: a first sub-pixel unit, a second sub-pixel unit, a third sub-pixel unit and a fourth sub-pixel unit;
   wherein in each of the plurality of light-emitting units, the plurality of light-emitting sub-units comprise: a first light-emitting sub-unit configured to emit a first light, and a second light-emitting sub-unit configured to emit a second light;
   the first light-emitting sub-unit is arranged corresponding to the first sub-pixel unit and the second sub pixel unit to transmit the first light through the first sub pixel unit and the second sub-pixel unit respectively, and then to display a first color and a second color respectively;
   the second light-emitting sub unit is arranged corresponding to the third sub pixel unit and the fourth sub-pixel unit to transmit the second light through the third sub pixel unit and the fourth sub-pixel unit respectively, and then to display a third color and a fourth color respectively.

2. The display device according to claim 1, wherein the first sub-pixel unit and the second sub-pixel unit are a red sub-pixel unit and a green sub-pixel unit, respectively, and the third sub-pixel unit and the fourth sub-pixel unit are a blue sub-pixel unit and a white sub-pixel unit, respectively;
   the first light-emitting sub-unit is a yellow light-emitting sub-unit and the first light is thus a yellow light; and
   the second light-emitting sub-unit is a white light-emitting sub-unit and the second light is thus a white light.

3. The display device according to claim 2, wherein the organic electroluminescent display panel is an Active-Matrix driving type organic electroluminescent display panel, which further comprises a driving unit configured to drive each of the plurality of light-emitting sub-units to emit light.

4. The display device according to claim 1, wherein the first sub-pixel unit and the second sub-pixel unit are a red sub-pixel unit and a blue sub-pixel unit, respectively, and the third sub-pixel unit and the fourth sub-pixel unit are a green sub-pixel unit and a white sub-pixel unit, respectively;
   the first light-emitting sub-unit is a violet light-emitting sub-unit and the first light is thus a violet light; and
   the second light-emitting sub-unit is a white light-emitting sub-unit and the second light is thus a white light.

5. The display device according to claim 4, wherein the organic electroluminescent display panel is an Active-Matrix driving type organic electroluminescent display panel, which further comprises a driving unit configured to drive each of the plurality of light-emitting sub-units to emit light.

6. The display device according to claim 1, wherein the first sub-pixel unit and the second sub-pixel unit are a green sub-pixel unit and a blue sub-pixel unit, respectively, and the third sub-pixel unit and the fourth sub-pixel unit are a red sub-pixel unit and a white sub-pixel unit, respectively;
   the first light-emitting sub-unit is a cyan light-emitting sub-unit and the first light is thus a cyan light; and
   the second light-emitting sub-unit is a white light-emitting sub-unit and the second light is thus a white light.

7. The display device according to claim 6, wherein the organic electroluminescent display panel is an Active-Matrix driving type organic electroluminescent display panel, which further comprises a driving unit configured to drive each of the plurality of light-emitting sub-units to emit light.

8. The display device according to claim 1, wherein the first sub-pixel unit and the second sub-pixel unit are a red sub-pixel unit and a green sub-pixel unit, respectively, and the third sub-pixel unit and the fourth sub-pixel unit are a blue sub-pixel unit and a yellow sub-pixel unit, respectively;
the first light-emitting sub-unit is a yellow light-emitting sub-unit and the first light is thus a yellow light; and
the second light-emitting sub-unit is a white light-emitting sub-unit and the second light is thus a white light.

9. The display device according to claim 8, wherein the organic electroluminescent display panel is an Active-Matrix driving type organic electroluminescent display panel, which further comprises a driving unit configured to drive each of the plurality of light-emitting sub-units to emit light.

10. The display device according to claim 1, wherein the first sub-pixel unit and the second sub-pixel unit are a red sub-pixel unit and a blue sub-pixel unit, respectively, and the third sub-pixel unit and the fourth sub-pixel unit are a green sub-pixel unit and a yellow sub-pixel unit, respectively;
the first light-emitting sub-unit is a violet light-emitting sub-unit and the first light is thus a violet light; and
the second light-emitting sub-unit is a yellow light-emitting sub-unit and the second light is thus a yellow light.

11. The display device according to claim 10, wherein the organic electroluminescent display panel is an Active-Matrix driving type organic electroluminescent display panel, which further comprises a driving unit configured to drive each of the plurality of light-emitting sub-units to emit light.

12. The display device according to claim 1, wherein the first sub-pixel unit and the second sub-pixel unit are a green sub-pixel unit and a blue sub-pixel unit, respectively, and the third sub-pixel unit and the fourth sub-pixel unit are a red sub-pixel unit and a yellow sub-pixel unit, respectively;
the first light-emitting sub-unit is a cyan light-emitting sub-unit and the first light is thus a cyan light; and
the second light-emitting sub-unit is a yellow light-emitting sub-unit and the second light is thus a yellow light.

13. The display device according to claim 12, wherein the organic electroluminescent display panel is an Active-Matrix driving type organic electroluminescent display panel, which further comprises a driving unit configured to drive each of the plurality of light-emitting sub-units to emit light.

14. The display device according to claim 1, wherein the area of each of the plurality of sub-pixel units is smaller than the area of a corresponding one of the plurality of light-emitting sub-units overlapping therewith, and an area of each of the plurality of pixel units is smaller than an area of a corresponding one of the plurality of light-emitting units overlapping therewith; and
wherein each of the plurality of light-emitting sub-units is a white light-emitting sub-unit emitting a white light.

15. The display device according to claim 14, wherein the organic electroluminescent display panel is an Active-Matrix driving type organic electroluminescent display panel, which further comprises a driving unit configured to drive each of the plurality of light-emitting sub-units to emit light.

16. The display device according to claim 1, wherein the organic electroluminescent display panel is an Active-Matrix driving type organic electroluminescent display panel, which further comprises a driving unit configured to drive each of the plurality of light-emitting sub-units to emit light.

* * * * *